United States Patent
Tsai et al.

(10) Patent No.: US 8,581,420 B2
(45) Date of Patent: Nov. 12, 2013

(54) UNDER-BUMP METALLIZATION (UBM) STRUCTURE AND METHOD OF FORMING THE SAME

(75) Inventors: Tsung-Fu Tsai, Changhua (TW); Yian-Liang Kuo, Toufen Township (TW); Chih-Horng Chang, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 196 days.

(21) Appl. No.: 13/009,377

(22) Filed: Jan. 19, 2011

(65) Prior Publication Data

US 2012/0091576 A1   Apr. 19, 2012

Related U.S. Application Data

(60) Provisional application No. 61/394,192, filed on Oct. 18, 2010.

(51) Int. Cl.
  *H01L 23/02* (2006.01)
(52) U.S. Cl.
  USPC ............................. 257/781; 257/780; 438/614
(58) Field of Classification Search
  USPC ................... 257/780, 781; 438/612, 613, 614
  See application file for complete search history.

(56) References Cited

U.S. PATENT DOCUMENTS

| | | | |
|---|---|---|---|
| 7,030,492 B2 | 4/2006 | Huang | |
| 7,446,422 B1 * | 11/2008 | Paek et al. | 257/779 |
| 2006/0027933 A1 | 2/2006 | Chen et al. | |
| 2007/0158391 A1 * | 7/2007 | Son et al. | 228/101 |
| 2009/0174052 A1 * | 7/2009 | Sogawa et al. | 257/690 |
| 2010/0258335 A1 | 10/2010 | Arvin et al. | |
| 2011/0001250 A1 * | 1/2011 | Lin et al. | 257/778 |
| 2012/0187558 A1 * | 7/2012 | Arvin et al. | 257/737 |

FOREIGN PATENT DOCUMENTS

CN    101075595    11/2007

OTHER PUBLICATIONS

Office Action dated Apr. 3, 2013 from corresponding application No. CN 201110243071.0.

* cited by examiner

*Primary Examiner* — S. V. Clark
(74) *Attorney, Agent, or Firm* — Lowe Hauptman & Ham, LLP

(57) ABSTRACT

An under-bump metallization (UBM) structure in a semiconductor device includes a copper layer, a nickel layer, and a Cu—Ni—Sn intermetallic compound (IMC) layer between the copper layer and the nickel layer.

20 Claims, 6 Drawing Sheets

UNDER-BUMP METALLIZATION (UBM) STRUCTURE AND METHOD OF FORMING THE SAME

CROSS-REFERENCE TO RELATED APPLICATIONS

The present application claims priority of U.S. Provisional Patent Application Ser. No. 61/394,192, filed on Oct. 18, 2010, which is incorporated herein by reference in its entirety.

TECHNICAL FIELD

This disclosure relates to the fabrication of semiconductor devices, and more particularly, to the fabrication of under-bump metallization (UBM) structures in semiconductor devices.

BACKGROUND

Modern integrated circuits are made up of literally millions of active and/or passive devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. In a typical bumping process, interconnect structures are formed on metallization layers, followed by the formation of under-bump metallization (UBM) and solder balls. Flip-chip packaging utilizes bumps to establish electrical contact between a chip's I/O pads and the substrate or lead frame of the package. Structurally, a bump actually contains the bump itself and the UBM located between the bump and an I/O pad. An UBM generally contains an adhesion layer, a barrier layer and a wetting layer, arranged in that order, on the I/O pad. The bumps themselves, based on the material used, are classified as solder bumps, gold bumps, copper pillar bumps and bumps with mixed metals. Usually, a material used for the solder bump is so-called Sn—Pb eutectic solder. Recently the semiconductor industry has been moving to "lead (Pb) free" packaging and lead-free device connector technology. This trend increasingly results in the use of lead free solder bumps and lead free solder balls to form connections with integrated circuits and packages. The use of lead free solder is safer for the environment, safer for workers in the industry and safer for consumers than lead based solder bumps or solder balls. Failure analysis revealed that Electromigration (EM) is a reliability concern in flip chip solder joints, which is initiated by the formation of intermetallic compounds (IMC) at the interface between UBM and solder alloys. Under EM, the continued growth of IMC accelerates the dissolution of UBM materials into solder alloys. This rapid dissolution and migration will cause an open circuit failure and interfacial cracks, which will degrade the joint strength and device lifetime.

DETAILED DESCRIPTION

Figure 1:
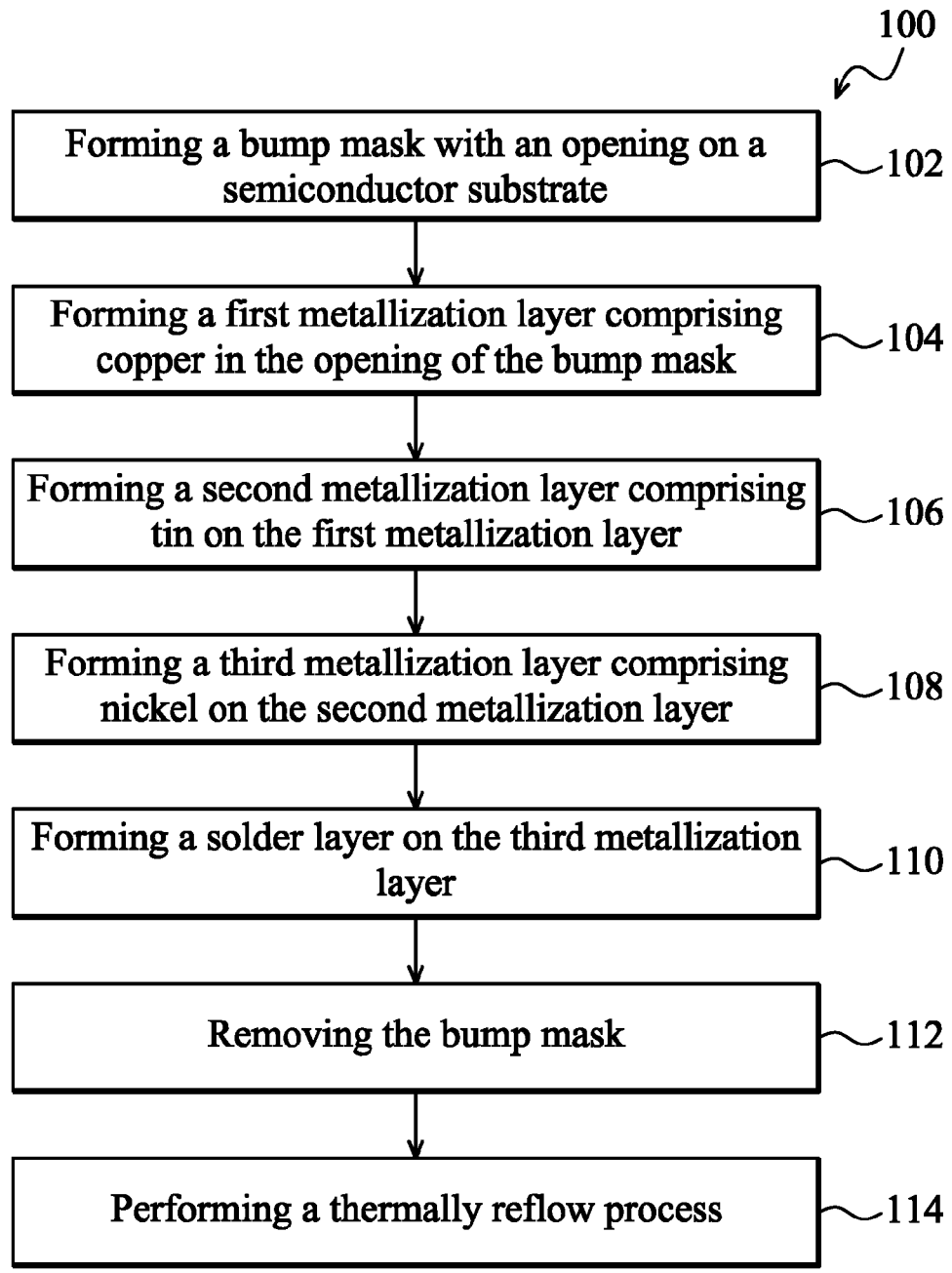
FIG. 1 is a flowchart of a method for fabricating a semiconductor device with a UBM structure according to various aspects of the present disclosure.

This disclosure provides UBM formation processes used in semiconductor devices applied to flip-chip assembly, wafer-level chip scale package (WLCSP), three-dimensional integrated circuit (3D-IC) stack, and/or any advanced package technology fields. Embodiments described herein relate to methods of forming solder bumps for use with semiconductor devices. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIG. 1 is a flowchart of a method for fabricating a semiconductor device with a UBM structure according to various aspects of the present disclosure.

Referring to FIG. 1, the method 100 begins with block 102 in which a bump mask with an opening is formed on a semiconductor substrate. The method 100 continues with block 104 in which a first metallization layer is formed in the opening of the bump mask. The first metallization layer comprises copper (Cu). In one embodiment, the first metallization layer is a copper layer. In one embodiment, the first metallization layer is a copper alloy layer. The method 100 continues with block 106 in which a second metallization layer is formed on the first metallization layer within the opening of the bump mask. The second metallization layer comprises tin (Sn). In one embodiment, the second metallization layer is a tin layer. In one embodiment, the second metallization layer is a tin alloy layer. The method 100 continues with block 108 in which a third metallization layer is formed on the second metallization layer within the opening of the bump mask. The third metallization layer comprises nickel (Ni). In one embodiment, the third metallization layer is a nickel layer. In one embodiment, the third metallization layer is a nickel alloy layer. The method 100 continues with block 110 in which a solder layer is formed on the third metallization layer within the opening of the bump mask. The method 100 continues with block 112 in which the bump mask is removed from the semiconductor substrate. The method 100 continues with block 114 in which a thermal reflow process is performed on the solder layer so as to form a solder bump. During the thermal reflow process, a first intermetallic compound (IMC) layer is formed between the first metallization layer and the third metallization layer. In one embodiment, the first IMC layer is a Cu—Ni—Sn IMC layer, for example, a $(Cu,Ni)_3Sn$ layer or a $(Cu,Ni)_6Sn_5$ layer. Also, a second IMC layer is formed between the third metallization layer and the solder bump. In one embodiment, the second IMC layer is a Ni—Sn IMC layer, for example, a $Ni_3Sn_4$ layer.

FIGS. 2A~2D are cross-sectional views of a portion of a semiconductor device at various stages of its fabrication according to one or more embodiments of the method of FIG. 1.

Figure 2A:
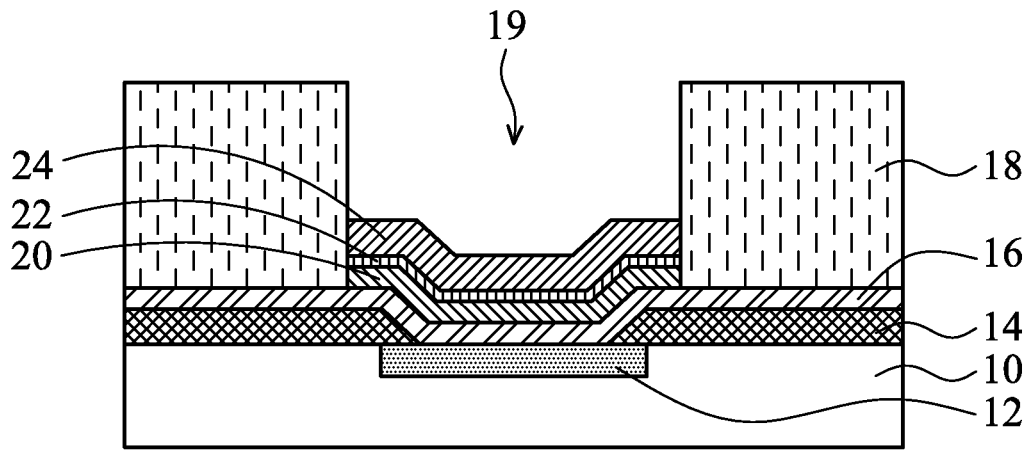
FIGS. 2A~2D are cross-sectional views of a portion of a semiconductor device at various stages of its fabrication according to one or more embodiments of the method of FIG. 1.

With reference to FIG. 2A, an exemplary semiconductor substrate 10 used for bump fabrication is employed in a semiconductor device fabrication, and integrated circuits may be formed therein and/or thereupon. The semiconductor substrate 10 is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The substrate 10 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; or other suitable elements. Various processes are performed to form the various microelectronic elements including deposition, etching, implantation, photolithography, annealing, or other suitable processes. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, or other suitable types of devices.

The semiconductor substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One skilled in the art will realize the formation details of the metallization layers. FIG. 2A depicts a conductive region 12 and a passivation layer 14 formed on the substrate 10. The conductive region 12 is a metallization layer formed over the inter-layer dielectric layers. The conductive region 12 is a portion of conductive routes and has an exposed surface treated by a planarization process, such as chemical mechanical polishing (CMP), if necessary. Suitable materials for the conductive region 12 may include, but are not limited to, for example copper, aluminum, copper alloy, or other mobile conductive materials, although it may also be formed of, or include, other materials such as copper, silver, gold, nickel, tungsten, alloys thereof, and/or multi-layers thereof. In one embodiment, the conductive region 12 is a pad region, a terminal region or an interconnect site of a conductive line, which may be used in the bonding process to connect the integrated circuits in the respective chip to external features. The passivation layer 14 is formed on the substrate 10, overlying the conductive region 12. Using photolithography and etching processes, the passivation layer 14 is patterned to form an opening exposing a portion of the conductive region 12. In one embodiment, the passivation layer 14 is formed of a non-organic material selected from un-doped silicate glass (USG), silicon nitride, silicon oxynitride, silicon oxide, and combinations thereof. In another embodiment, the passivation layer 14 is formed of a polymer layer, such as an epoxy, polyimide, benzocyclobutene (BCB), polybenzoxazole (PBO), and the like, although other relatively soft, often organic, dielectric materials can also be used.

FIG. 2A also depicts the formation of a bottom metallization layer 16 on the passivation layer 14, electrically connected to the conductive region 12. The bottom metallization layer 16 is formed on the passivation layer 14 and the exposed portion of the conductive region 12. In an embodiment, the bottom metallization layer 16 includes a diffusion barrier layer and/or a seed layer. The diffusion barrier layer, also referred to as a glue layer, is formed to cover the sidewalls and the bottom of the opening of the passivation layer 14. The diffusion barrier layer may be formed of titanium, although it may also be formed of other materials such as titanium nitride, tantalum, tantalum nitride, or the like. The formation methods include physical vapor deposition (PVD) or sputtering. The seed layer may be a copper seed layer formed on the diffusion barrier layer using PVD or sputtering. The seed layer may be formed of copper alloys that include silver, chromium, nickel, tin, gold, or combinations thereof. In one embodiment, the bottom metallization layer 16 includes a Ti layer and a Cu seed layer. The diffusion barrier layer may have a thickness about 1000~2000 Angstroms, and the seed layer may have a thickness equal to about 3000~7000 Angstroms, although their thicknesses may also be greater or smaller. The dimensions recited throughout the description are merely examples, and will be scaled with the downscaling of integrated circuits.

FIG. 2A further depicts the formation a bump mask layer 18 provided on the bottom metallization layer 16 and patterned with an opening 19 for example, by exposure, development or etching, so that a portion of the bottom metallization layer 16 is exposed. The bump mask layer 18 may be a dry film or a photoresist film. In an embodiment, the bump mask layer 18 is a dry film, and may be formed of an organic material. In alternative embodiments, the bump mask layer 18 is formed of a photo resist. The thickness of the bump mask layer 18 may be greater than about 5 μm, or even between about 10 μm and about 120 μm.

Figure 2B:
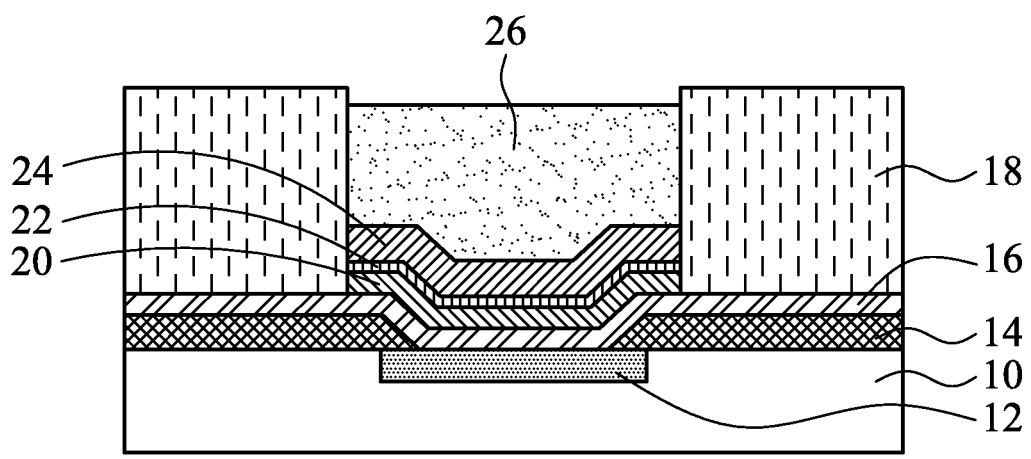

Next, as shown in FIG. 2B, a first metallization layer 20, a second metallization layer 22, a third metallization layer 24 and a solder layer 26 are successively deposited in the opening 19 of the bump mask 18. The first metallization layer 20 comprises copper. In one embodiment, the first metallization layer 20 is a copper layer. In some embodiments, the first metallization layer 20 is a copper alloy layer. The first metallization layer 20 has a thickness less than 10 μm. In some embodiments, the first metallization layer 20 has a thickness about 1~10 μm, for example about 4~8 μm, although the thickness may be greater or smaller. The formation method of the metallization layer 20 may include electroplating methods.

The second metallization layer 22 comprises tin. In one embodiment, the second metallization layer 22 is a tin layer. In some embodiments, the second metallization layer 22 is a tin alloy layer. The second metallization layer 22 has a thickness less than ¾ of the thickness of the first metallization layer 20, although the thickness may be greater or smaller. In some embodiments, the second metallization layer is less than about 10 μm thick, for example, 1~5 μm thickness. The formation method of second metallization layer 22 includes an electroplating or an immersion process.

The third metallization layer 24 comprises nickel. In one embodiment, the third metallization layer 24 is a nickel layer. In some embodiments, the third metallization layer 24 is a nickel alloy layer, for example nickel-palladium-gold (NiPdAu), nickel-gold (NiAu), nickel-palladium (NiPd) or other similar alloys. The third metallization layer 24 has a thickness less than 10 μm. In some embodiments, the third metallization layer 24 has a thickness less than 5 μm, for example about 0.02~5 μm, although the thickness may be greater or smaller. The third metallization layer 24 can be deposited by electroless or immersion metal deposition process.

The solder layer 26 is made of Sn, SnAg, Sn—Pb, SnAgCu, SnAgZn, SnZn, SnBi—In, Sn—In, Sn—Au, SnPb, SnCu, SnZnIn, or SnAgSb, etc. In one embodiment, the solder layer 26 is a lead-free solder material layer. The solder layer 26 has a thickness greater than 30 μm. In some embodiments, the solder layer 26 has a thickness about 40~70 μm, although the thickness may be greater or smaller.

Figure 2C:
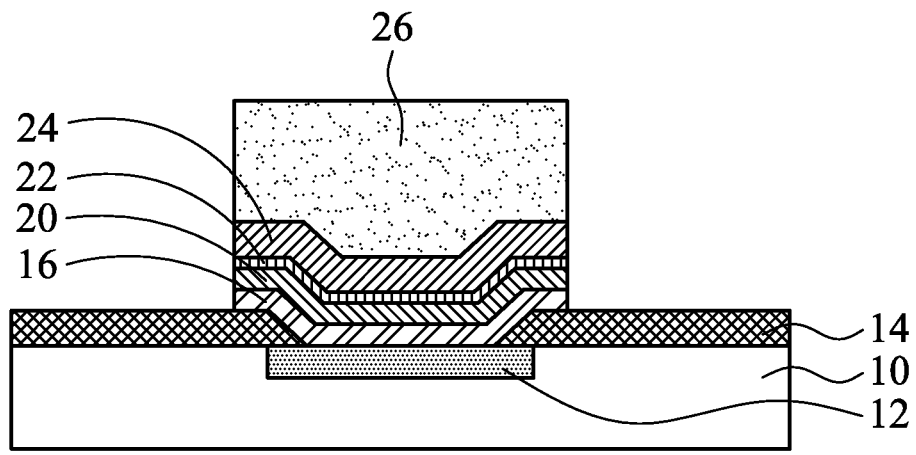

Next, as shown in FIG. 2C, the bump mask layer 18 is removed, and then the uncovered portion of the bottom metallization layer 16 is removed to expose the underlying passivation layer 14 by etching methods, such as wet etching, dry etching or the like.

Figure 2D:
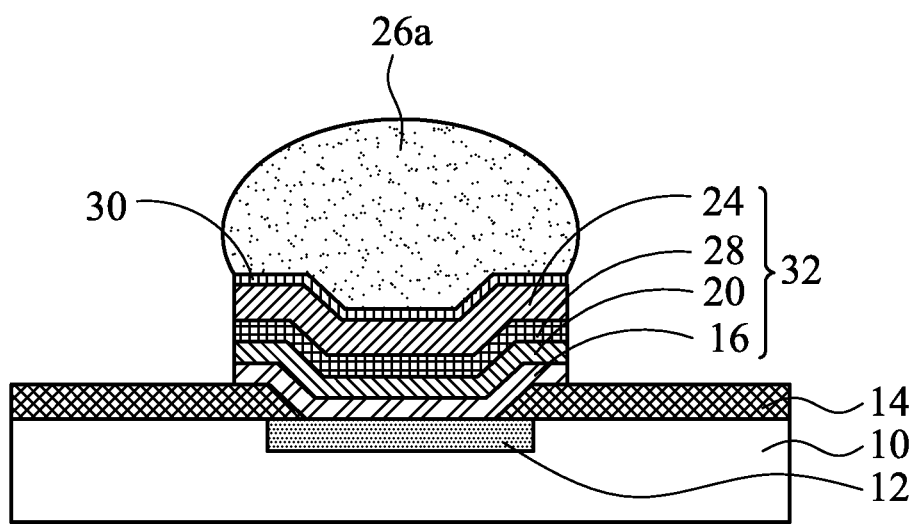

Referring to FIG. 2D, a thermal reflow process is performed on the solder layer 26, forming a ball-shaped solder bump 26a. The solder bump 26a of the embodiments may be various sizes in diameter and may include so-called "microbumps". For example, the solder bump 26a may be 65-80 microns in diameter. The pitch between solder bumps 26a may be less than 150 microns, such as 130-140 microns, and may in the future get even smaller. For micro-bump applications, the pitch may be 20-50 microns, and the diameter may be between 10-25 microns as well.

During the thermal reflow process, the tin (Sn) in the second metallization layer 22 tends to react with nickel (Ni) in the third metallization layer 24 and the copper (Cu) in the first metallization layer 20 to form an intermetallic compound (IMC) layer therebetween. In one embodiment, the second metallization layer 22 is consumed during the IMC formation, resulting in a Cu—Ni—Sn IMC layer 28 between the first metallization layer 20 and the third metallization layer 24. Also, the nickel (Ni) in the third metallization layer 24 tends to react with tin (Sn) in the solder layer 26 to form another intermetallic compound (IMC) layer therebetween. In one embodiment, the third metallization layer 24 is partially consumed during the IMC formation, resulting in a Ni—Sn IMC layer 30 between the solder bump 26a and the third metallization layer 24. For example, the IMC layer 30 is a $Ni_3Sn_4$ layer 30.

This completes an under-bump metallization (UBM) structure 32 underlying the solder bump 26a. The UBM structure 32 includes the bottom metallization layer 16, the first metallization layer 20, the Cu—Ni—Sn IMC layer 28, and the third metallization layer 24. The Ni—Sn IMC layer 30 is formed between the UBM structure 32 and the solder bump 26a. The Cu—Ni—Sn IMC layer 28 can act as a diffusion barrier to prevent the Cu atoms in the first metallization layer 20 from being consumed during Electro-migration (EM) test. Also, the Cu—Ni—Sn IMC layer 28 can slow down or restrict the UBM dissolution so as to mitigate the EM early failure.

Figure 3:
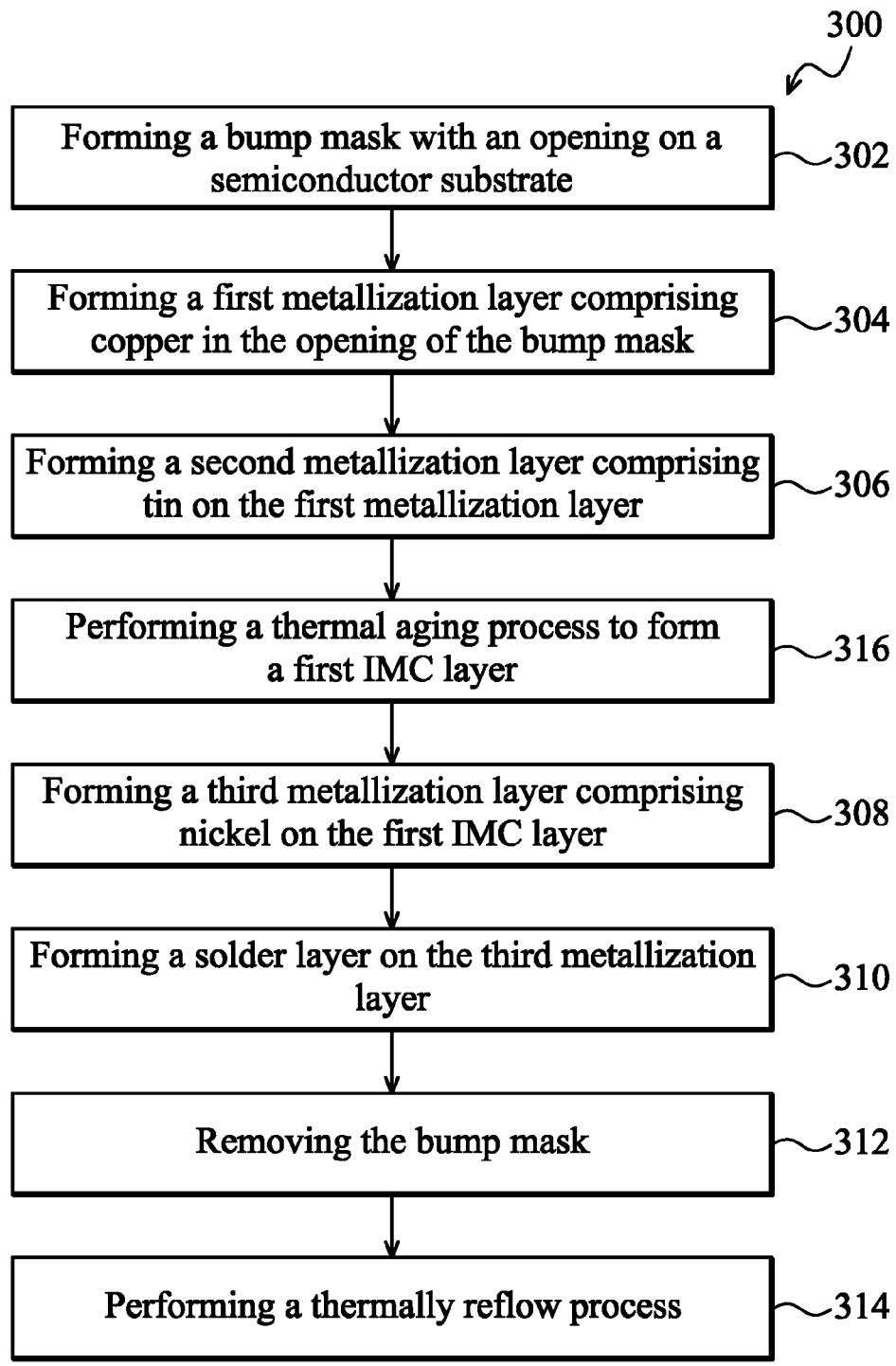
FIG. 3 is a flowchart of a method for fabricating a semiconductor device with a UBM structure according to various aspects of the present disclosure.

FIG. 3 is a flowchart of a method for fabricating a semiconductor device with a UBM structure according to various aspects of the present disclosure.

Referring to FIG. 3, the method 300 begins with block 302 in which a bump mask with an opening is formed on a semiconductor substrate. The method 300 continues with block 304 in which a first metallization layer is formed in the opening of the bump mask. The first metallization layer comprises copper (Cu). In one embodiment, the first metallization layer is a copper layer. In one embodiment, the first metallization layer is a copper alloy layer. The method 300 continues with block 306 in which a second metallization layer is formed on the first metallization layer within the opening of the bump mask. The second metallization layer comprises tin (Sn). In one embodiment, the second metallization layer is a tin layer. In one embodiment, the second metallization layer is a tin alloy layer. The method 300 continues with block 316 in which a thermal aging process is performed to form the second metallization layer into a first IMC layer. In one embodiment, the first IMC layer comprises a Cu—Sn IMC layer, for example, a $Cu_3Sn$ layer. The method 300 continues with block 308 in which a third metallization layer is formed on the first IMC layer within the opening of the bump mask. The third metallization layer comprises nickel (Ni). In one embodiment, the third metallization layer is a nickel layer. In one embodiment, the third metallization layer is a nickel alloy layer. The method 300 continues with block 310 in which a solder layer is formed on the third metallization layer within the opening of the bump mask. The method 300 continues with block 312 in which the bump mask is removed from the semiconductor substrate. The method 300 continues with block 314 in which a thermal reflow process is performed on the solder layer so as to form a solder bump. During the thermal reflow process, the first IMC layer between the first metallization layer and the third metallization layer is further formed into a second IMC layer. In one embodiment, the second IMC layer is a Cu—Ni—Sn IMC layer, for example, a $(Cu,Ni)_3Sn$ or $(Cu,Ni)_6Sn_5$ layer. Also, a third IMC layer is formed between the third metallization layer and the solder bump. In one embodiment, the third IMC layer is a Ni—Sn IMC layer, for example, a $Ni_3Sn_4$ layer.

FIGS. 4A~4D are cross-sectional views of a portion of a semiconductor device at various stages of its fabrication according to one or more embodiments of the method of FIG. 3. The explanation of the same or similar portions to the description in FIG. 2A to FIG. 2D will be omitted.

Figure 4A:
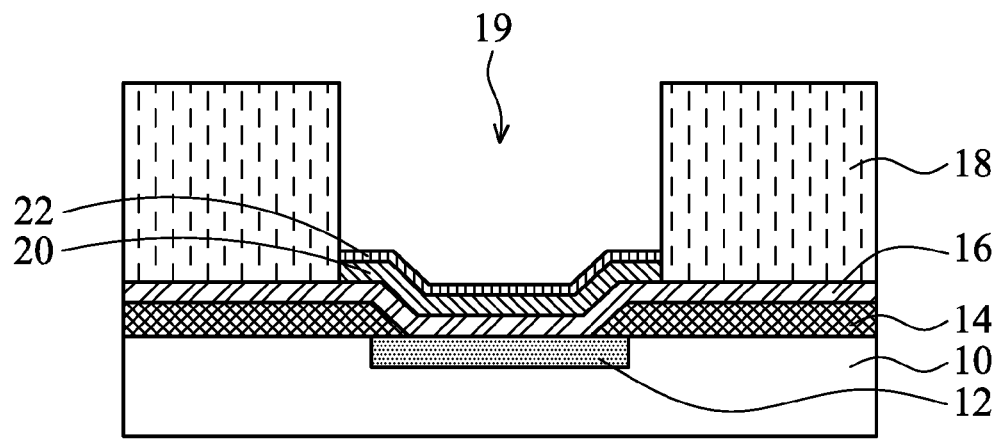
FIGS. 4A~4D are cross-sectional views of a portion of a semiconductor device at various stages of its fabrication according to one or more embodiments of the method of FIG. 3.

With reference to FIG. 4A, a conductive region 12, a passivation layer 14 and a bottom metallization layer 16 are formed on a semiconductor substrate 10 followed by the formation of a bump mask 18. Then a first metallization layer 20 and a second metallization layer 22 are successfully deposited in the opening 19 of the bump mask 18. The first metallization layer 20 comprises copper. In one embodiment, the first metallization layer 20 is a copper layer. In some embodiments, the first metallization layer 20 is a copper alloy layer. The first metallization layer 20 has a thickness less than 10 μm. In some embodiments, the first metallization layer 20 has a thickness about 1~10 μm, for example about 4~8 μm, although the thickness may be greater or smaller. The formation method of the metallization layer 20 may include electroplating methods.

The second metallization layer 22 comprises tin. In one embodiment, the second metallization layer 22 is a tin layer. In some embodiments, the second metallization layer 22 is a tin alloy layer. The second metallization layer 22 has a thickness less than ¾ of the thickness of the first metallization layer 20, although the thickness may be greater or smaller. In some embodiments, the second metallization layer is less than about 10 µm thick, for example, 1~5 µm thickness. The formation method of second metallization layer 22 includes an electroplating or an immersion process.

Figure 4B:
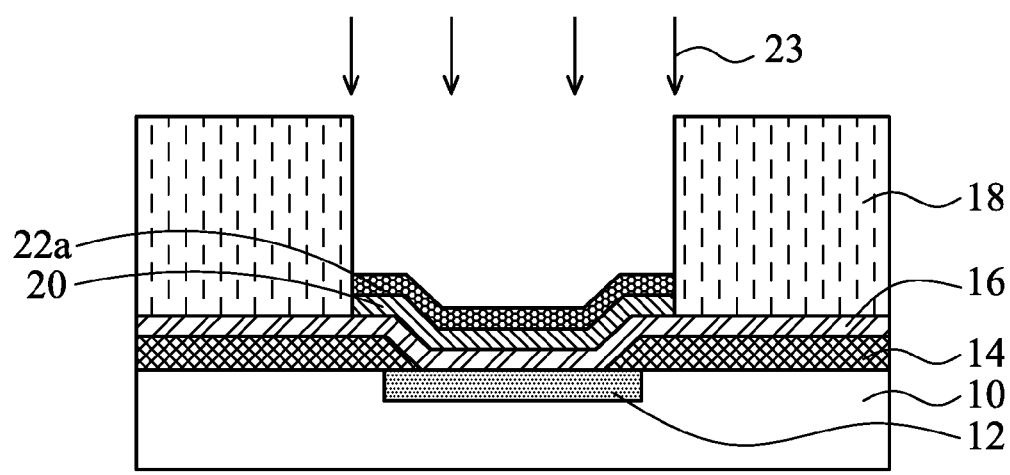

Next, as shown in FIG. 4B, a thermal aging process 23 is applied to the structure at a temperature of about 190~230° C. for about 30 s~5 minutes. It is noted that most of dry films used for the bump mask cannot sustain such a high temperature, and therefore an extra litho process is needed or a novel dry film should be adopted. During the thermal aging process 23, interaction and interdiffusion behaviors between the first metallization layer 20 and the second metallization layer 22 occur so that the second metallization layer 22 is formed into a first IMC layer 22a. In one embodiment, Cu atoms diffuse from the first metallization layer 20 into the second metallization layer 22 to form a Cu—Sn IMC layer 22a. The second metallization layer 22 is consumed during the IMC formation. In one embodiment, the Cu—Sn IMC layer 22a is a $Cu_3Sn$ IMC layer.

Figure 4C:
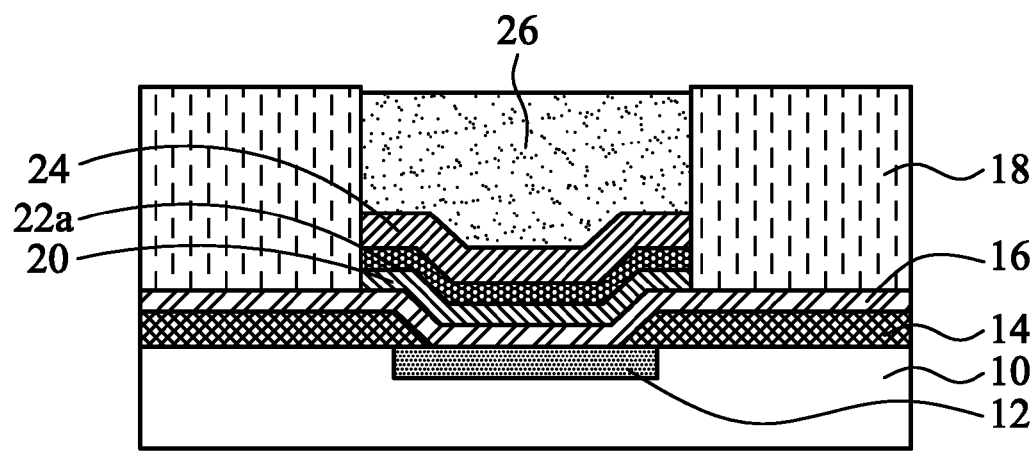

Next, as shown in FIG. 4C, a third metallization layer 24 and a solder layer 26 are successfully formed in the opening 19 of the bump mask 18. The third metallization layer 24 comprises nickel. In one embodiment, the third metallization layer 24 is a nickel layer. In some embodiments, the third metallization layer 24 is a nickel alloy layer, for example nickel-palladium-gold (NiPdAu), nickel-gold (NiAu), nickel-palladium (NiPd) or other similar alloys. The third metallization layer 24 has a thickness less than 10 µm. In some embodiments, the third metallization layer 24 has a thickness less than 5 µm, for example about 0.02~5 µm, although the thickness may be greater or smaller. The third metallization layer 24 can be deposited by electroless or immersion metal deposition process. The solder layer 26 is made of Sn, SnAg, Sn—Pb, SnAgCu, SnAgZn, SnZn, SnBi—In, Sn—In, Sn—Au, SnPb, SnCu, SnZnIn, or SnAgSb, etc. In one embodiment, the solder layer 26 is a lead-free solder material layer. The solder layer 26 has a thickness greater than 30 µm. In some embodiments, the solder layer 26 has a thickness about 40 ~70 µm, although the thickness may be greater or smaller.

Figure 4D:
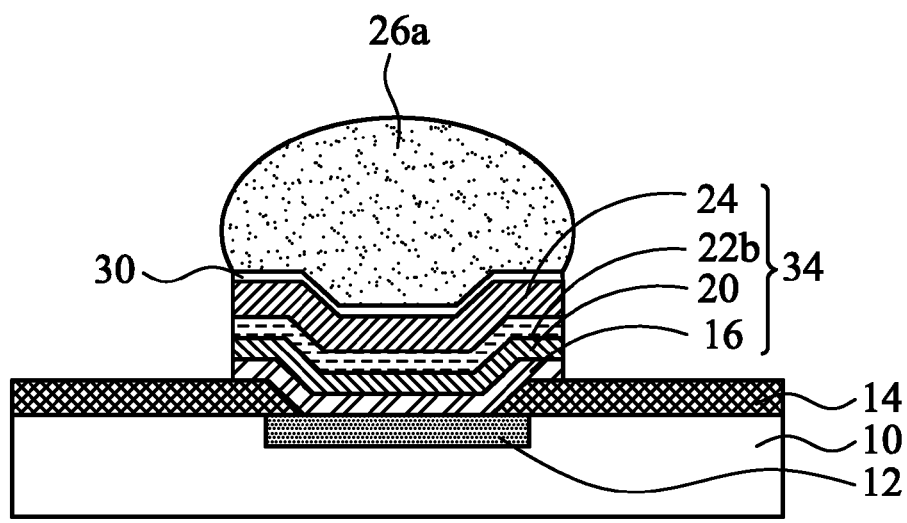

Next, as shown in FIG. 4D, the bump mask layer 18 is removed, and then the uncovered portion of the bottom metallization layer 16 is removed to expose the underlying passivation layer 14 by etching methods, such as wet etching, dry etching or the like. Thereafter, a thermal reflow process is performed on the solder layer 26, forming a ball-shaped solder bump 26a. The solder bump 26a of the embodiments may be various sizes in diameter and may include so-called "micro-bumps".

During the thermal reflow process, interaction and interdiffusion behaviors between the third metallization layer 24 and the first IMC layer 22a occur so that the first IMC layer 22a is further formed into a second IMC layer 22b. In one embodiment, the nickel (Ni) in the third metallization layer 24 tends to migrate into the first IMC layer 22a, resulting in a Cu—Ni—Sn IMC layer 22b between the first metallization layer 20 and the third metallization layer 24. For example, the IMC layer 22b is a $(Cu, Ni)_3Sn$ or $(Cu,Ni)_6Sn_5$ layer.

Also, the nickel (Ni) in the third metallization layer 24 tends to react with tin (Sn) in the solder layer 26 to form another intermetallic compound (IMC) layer 30 therebetween. In one embodiment, the third metallization layer 24 is partially consumed during the IMC formation, resulting in a Ni—Sn IMC layer 30 between the solder bump 26a and the third metallization layer 24. For example, the IMC layer 30 is a $Ni_3Sn_4$ layer 30.

This completes an under-bump metallization (UBM) structure 34 underlying the solder bump 26a. The UBM structure 34 includes the bottom metallization layer 16, the first metallization layer 20, the Cu—Ni—Sn IMC layer 22b, and the third metallization layer 24. The Ni—Sn IMC layer 30 is formed between the UBM structure 34 and the solder bump 26a. The Cu—Ni—Sn IMC layer 22b can act as a diffusion barrier to prevent the Cu atoms in the first metallization layer 20 from being consumed during Electro-migration (EM) test. Also, the Cu—Ni—Sn IMC layer 22b can slow down or restrict the UBM dissolution so as to mitigate the EM early failure.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of the concepts as expressed herein.

What is claimed is:

1. A semiconductor device, comprising:
   a semiconductor substrate;
   an under-bump metallization (UBM) structure overlying the semiconductor substrate; and
   a solder bump overlying and electrically connected to the UBM structure;
   wherein the UBM structure comprises a copper-containing metallization layer, a nickel-containing metallization layer and a first intermetallic compound (IMC) layer between the copper-containing metallization layer and the nickel-containing metallization layer.

2. The semiconductor device of claim 1, wherein the first IMC layer is a Cu—Ni—Sn IMC layer.

3. The semiconductor device of claim 1, further comprising a second IMC layer between UBM structure and the solder bump.

4. The semiconductor device of claim 3, wherein the second IMC layer is a Ni—Sn IMC layer.

5. The semiconductor device of claim 1, wherein the copper-containing metallization layer is formed overlying the semiconductor substrate, the first IMC layer is formed on the copper-containing metallization layer, and the nickel-containing metallization layer is formed on the first IMC layer.

6. The semiconductor device of claim 5, wherein the UBM structure further comprises a bottom metallization layer underlying the copper-containing metallization layer.

7. The semiconductor device of claim 6, wherein the bottom metallization layer comprises at least one of titanium (Ti) and copper (Cu).

8. The semiconductor device of claim 1, wherein the solder bump is lead-free.

9. A method of forming a semiconductor device, said method comprising:
   forming a mask layer with an opening overlying a semiconductor substrate;

forming a first metallization layer in the opening of the mask layer, wherein the first metallization layer comprises copper (Cu);

forming a second metallization layer overlying the first metallization layer, wherein the second metallization layer comprises tin (Sn);

forming a third metallization layer overlying the second metallization layer, wherein the third metallization layer comprises nickel (Ni);

forming a solder layer overlying the third metallization layer;

removing the mask layer; and performing a thermal reflow process on the solder layer.

10. The method of claim 9, wherein a first intermetallic compound (IMC) layer is formed, between the first metallization layer and the third metallization layer.

11. The method of claim 10, wherein the first IMC layer is a Cu—Ni—Sn IMC layer.

12. The method of claim 9, wherein a second intermetallic compound (IMC) layer is formed between the third metallization layer and the solder layer.

13. The method of claim 12, wherein the second IMC layer is a Ni—Sn IMC layer.

14. The method of claim 9, further comprising performing a thermal aging process after forming the second metallization layer and before forming the third metallization layer.

15. The method of claim 9, before forming the mask layer, further comprising forming a bottom metallization layer overlying the semiconductor substrate, wherein the mask layer is formed on the bottom metallization layer to expose a portion of the bottom metallization layer.

16. The method of claim 15, wherein the bottom metallization layer comprises at least one of titanium (Ti) and copper (Cu).

17. The method of claim 9, wherein the solder layer is lead-free.

18. A method of forming a semiconductor device, said method comprising:

providing a semiconductor substrate comprising a pad region;

forming a passivation layer overlying the semiconductor substrate, while exposing a portion of the pad region;

forming a metallization layer overlying the passivation layer and the exposed portion of the pad region;

forming a mask layer with an opening overlying the metallization layer;

forming a copper (Cu) layer in the opening of the mask layer;

forming a tin (Sn) layer on the Cu layer;

forming a nickel (Ni) layer on the Sn layer;

forming a solder layer on the Ni layer;

removing the mask layer to expose a portion of the metallization layer;

removing the exposed portion of the metallization layer; and performing a thermal reflow process on the solder layer.

19. The method of claim 18, wherein a Cu—Ni—Sn intermetallic compound (IMC) layer is formed between the Cu layer and the Ni layer, and a Ni—Sn intermetallic compound (IMC) layer is formed between the Ni layer and the solder layer.

20. The method of claim 18, further comprising performing a thermal aging process after forming the Sn layer.

* * * * *